(12) United States Patent
Wyatt

(10) Patent No.: US 7,668,522 B2
(45) Date of Patent: *Feb. 23, 2010

(54) ULTRA WIDE BAND, DIFFERENTIAL INPUT/OUTPUT, HIGH FREQUENCY ACTIVE COMBINER IN AN INTEGRATED CIRCUIT

(75) Inventor: Michael A. Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 480 days.

This patent is subject to a terminal disclaimer.

(21) Appl. No.: 11/504,430

(22) Filed: Aug. 15, 2006

(65) Prior Publication Data

US 2008/0032648 A1 Feb. 7, 2008

Related U.S. Application Data

(60) Provisional application No. 60/817,509, filed on Jun. 29, 2006.

(51) Int. Cl.
*H04B 1/16* (2006.01)

(52) U.S. Cl. .................... 455/232.1; 455/137; 455/296; 455/313; 455/323; 455/333

(58) Field of Classification Search ............ 455/232.1, 455/137, 296, 313, 323, 333
See application file for complete search history.

(56) References Cited

U.S. PATENT DOCUMENTS 5,489,872 A    2/1996    Gopinathan (Continued)

FOREIGN PATENT DOCUMENTS

EP    1 003 281 A    5/2000

(Continued)

OTHER PUBLICATIONS

Lakshmikumar K.R. et al.: "A CMOS Analog Front-End Processor For An FDM System" Proceedings of the Custom INtegrated Circuits Conference. Boston, May 13-16, 1990, New York, IEEE, U.S., vol. Conf. 12, May 13, 1990, pp. 1241-1245.

(Continued)

*Primary Examiner*—Sanh D Phu
(74) *Attorney, Agent, or Firm*—RatnerPrestia

(57) ABSTRACT

A wideband combiner includes a core amplifier for receiving first and second pairs of differential input signals and providing a single pair of differential output signals. The pair of differential output signals are a combination of the first and second pair of differential input signals and a signal gain is implemented between the received first and second pairs of differential input signals and the single pair of differential output signals. The core amplifier is configured to provide a gain value between the first and second pairs of differential input signals and the single pair of differential output signals. The signal gain is substantially constant across the frequency bandwidth of the core amplifier. A bandwidth peaking network is coupled to the core amplifier and includes (a) a first coil and a first resistor connected in series and (b) a second coil and a second resistor connected in series.

19 Claims, 11 Drawing Sheets

U.S. PATENT DOCUMENTS

| | | | |
|---|---|---|---|
| 5,532,637 A * | 7/1996 | Khoury et al. | 327/359 |
| 6,292,033 B1 | 9/2001 | Enriquez | |
| 7,035,616 B2 * | 4/2006 | Reynolds | 455/326 |
| 7,403,758 B2 * | 7/2008 | Rector | 455/232.1 |
| 2005/0264356 A1 | 12/2005 | Kucharski | |
| 2008/0003872 A1 * | 1/2008 | Chen et al. | 439/578 |

FOREIGN PATENT DOCUMENTS

| | | |
|---|---|---|
| EP | 1 083 655 A | 3/2001 |
| EP | 1 130 771 A | 9/2001 |
| EP | 1 306 970 A | 5/2003 |
| WO | WO 03/049282 A | 6/2003 |

OTHER PUBLICATIONS

Arai T. et al.: "A GM-C Filter Using Multiple-Output Linearized Transconductors", IEICE Transactions on Fundamentals of Electronics, Communications and Computer Sciences, Engineering Sciences Society, Tokyo, JP, vol. E87-A, No. 2, Feb. 2004, pp. 384-389.

Huang S-C et al. Institute of Electrical and Electronics Engineers: "A CMOS Differential Difference Amplifier With Rail-To-Rail Fully-Differential Outputs" Proceedings of the Midwest Symposium on Circuits and Systems. Lafayette, Aug. 3-5, 1994, New York, IEEE, US, vol. VOL. 2 Symp. 37, Aug. 1, 1994, pp. 780-781.

* cited by examiner

80

| Q1 | Q2 |
|---|---|
| Q19 | Q76 |

| HALF R36A | HALF R36B |
|---|---|
| HALF R36B | HALF R36A |

FIG. 9

ULTRA WIDE BAND, DIFFERENTIAL INPUT/OUTPUT, HIGH FREQUENCY ACTIVE COMBINER IN AN INTEGRATED CIRCUIT

CROSS REFERENCE TO RELATED APPLICATIONS

This application claims priority of U.S. Provisional Patent Application Ser. No. 60/817,509, filed Jun. 29, 2006.

FIELD OF THE INVENTION

The present invention relates, in general, to a high frequency combiner. More specifically, the present invention relates to an ultra wide band (from DC to greater than 20 GHz) active combiner that is fabricated as an integrated circuit, and has differential input/output signal capabilities.

BACKGROUND OF THE INVENTION

A combiner receives two input signals and generates a combined output signal. The frequency components of the output signal are generally similar to the frequency components of the input signals. A combiner typically has a loss of gain (in other words an attenuation).

When combining very low level signals, there is a need to amplify the combined signals before further processing is performed. Hence, there is typically a need for an amplifier stage. In wide band applications, the combiner stage and the amplifier stage must be designed to respond to the entire frequency band of operation. These are difficult design requirements.

It is difficult to fabricate a wide band combiner on a die for use as an integrated circuit (IC). It is even more difficult to fabricate an ultra wide band active combiner on a die having gain across a frequency band that spans from direct current (DC) up to a frequency in excess of 20 GHz. The present invention addresses such a combiner.

SUMMARY OF THE INVENTION

To meet this and other needs, and in view of its purposes, the present invention provides a wideband combiner including a core amplifier for receiving first and second pairs of differential input signals and providing a single pair of amplified, differential output signals. The pair of differential output signals are a combination of the first pair and the second pair of differential input signals. A signal gain is implemented between the received first and second pairs of differential input signals and the single pair of differential output signals.

The combiner may also include (1) a bandwidth peaking network having (a) a first coil and a first resistor connected in series, and (b) a second coil and a second resistor connected in series, and (2) the first coil and resistor and the second coil and resistor, respectively, are coupled to the core amplifier for receiving the amplified differential output signals. The bandwidth peaking network is configured to increase the frequency bandwidth of the combiner.

The bandwidth peaking network may include (a) a first node formed between the first coil and first resistor, (b) a second node formed between the second coil and second resistor, and (c) a third resistor connected between the first node and the second node. The third resistor is free of any current flow at low frequency operation of the combiner.

The combiner further includes a common mode bias network coupled between the output terminals for providing a voltage bias control feedback signal across the input terminals. The voltage bias control feedback signal is derived from a virtual ground common mode potential across the output terminals.

A second aspect of the present invention includes a core amplifier for receiving first and second pairs of differential input signals and providing a single pair of differential output signals, with the core amplifier including a first amplifier and a second amplifier for receiving the first and second pairs of differential input signals.

A third aspect of the present invention includes a core amplifier that provides a substantially constant gain between the received first and second pairs of differential input signals and the single pair of differential output signals.

It is understood that the foregoing general description and the following detailed description are exemplary, but not restrictive, of the invention.

BRIEF DESCRIPTION OF THE DRAWING

The invention is best understood from the following detailed description when read in connection with the accompanying drawing. Included in the drawing are the following figures:

FIGS. 8 and 9 are layouts showing the partitioning of transistors and resistors, which are located in a common centroid arrangement on a die, in accordance with an embodiment of the present invention;

DETAILED DESCRIPTION OF THE INVENTION

As will be described, the present invention provides an ultra wide band active combiner, providing gain while operating between direct current (DC) and frequencies greater than 20 GHz. The present invention includes a bandwidth peaking network that extends the frequency response of the combiner and provides a substantially constant gain across that frequency response. In addition, the present invention receives two pairs of differential input signals and transmits one pair of differential output signals. The present invention also has controlled input impedances and a controlled output impedance. Moreover, the present invention operates with a low supply voltage and includes a common mode biasing method for alternating current (AC) applications, and an accurate fixed ratio bias tracking scheme. These features all contribute to advantageous improvements of an ultra wide band active combiner that provides amplification and is disposed on a die fabricated for use in an integrated circuit (IC) or chip.

Figure 1:
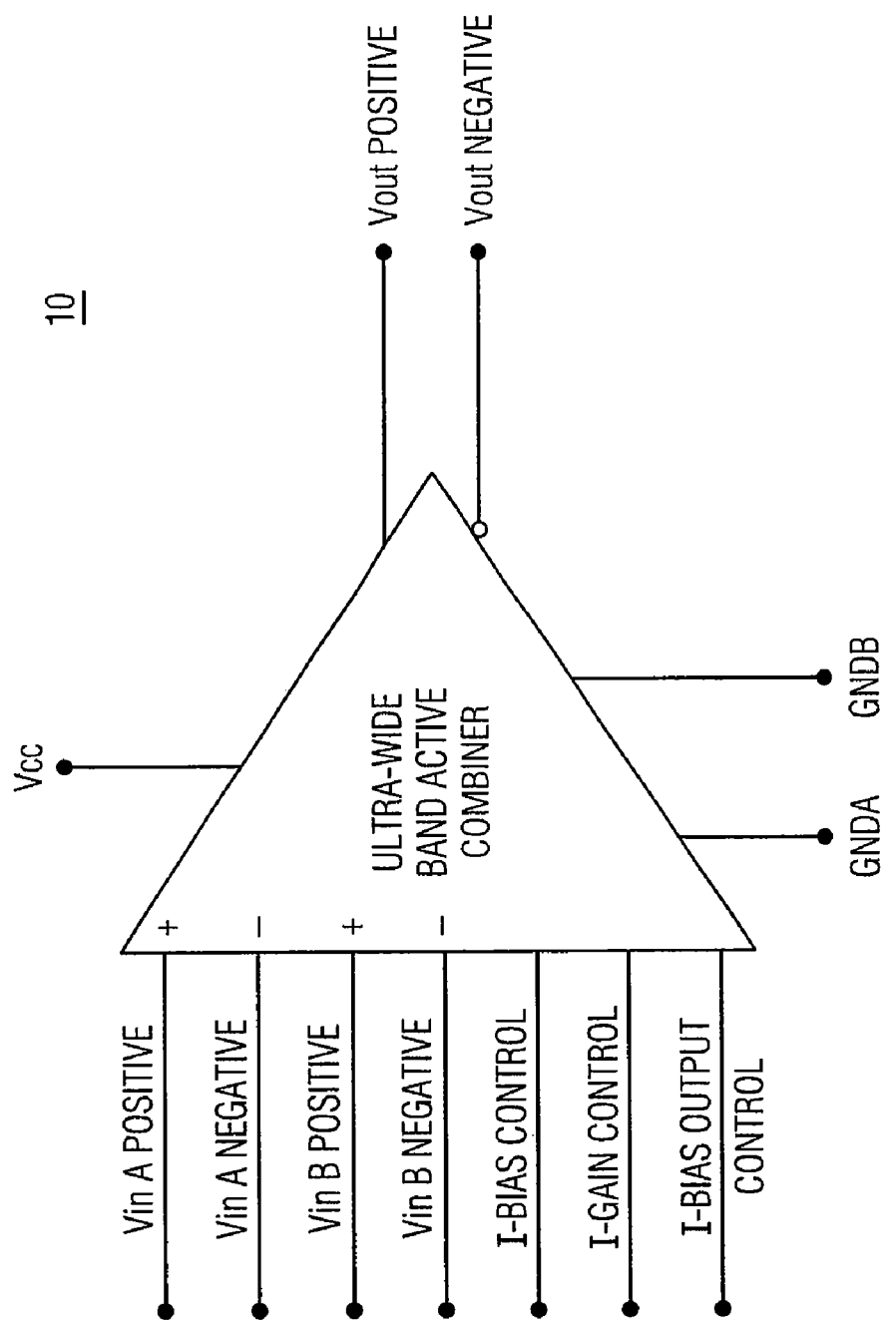
FIG. 1 is a functional diagram of the input and output signals of an ultra wide band active combiner, in accordance with an embodiment of the present invention.

Referring to FIG. 1, there is shown a functional input/output block diagram of an ultra wide band active combiner, generally designated as 10. In accordance with an embodiment of the present invention, ultra wide band active combiner 10 includes two pairs of differential input signals, respectively shown as Vin A positive and Vin A negative and Vin B positive and Vin B negative. The ultra wide band active combiner 10 also includes differential output signals, shown as Vout positive and Vout negative. The ultra wide band active combiner 10 also includes biasing controls, shown as current (I)-bias output control, I-bias control, and I-gain adjust. These different biasing and gain adjust controls will be described later. Lastly, as shown in FIG. 1, ultra wide band active combiner 10 includes a VCC primary power input of nominally 3.0 volts and GNDA and GNDB ground potentials.

Figure 2:
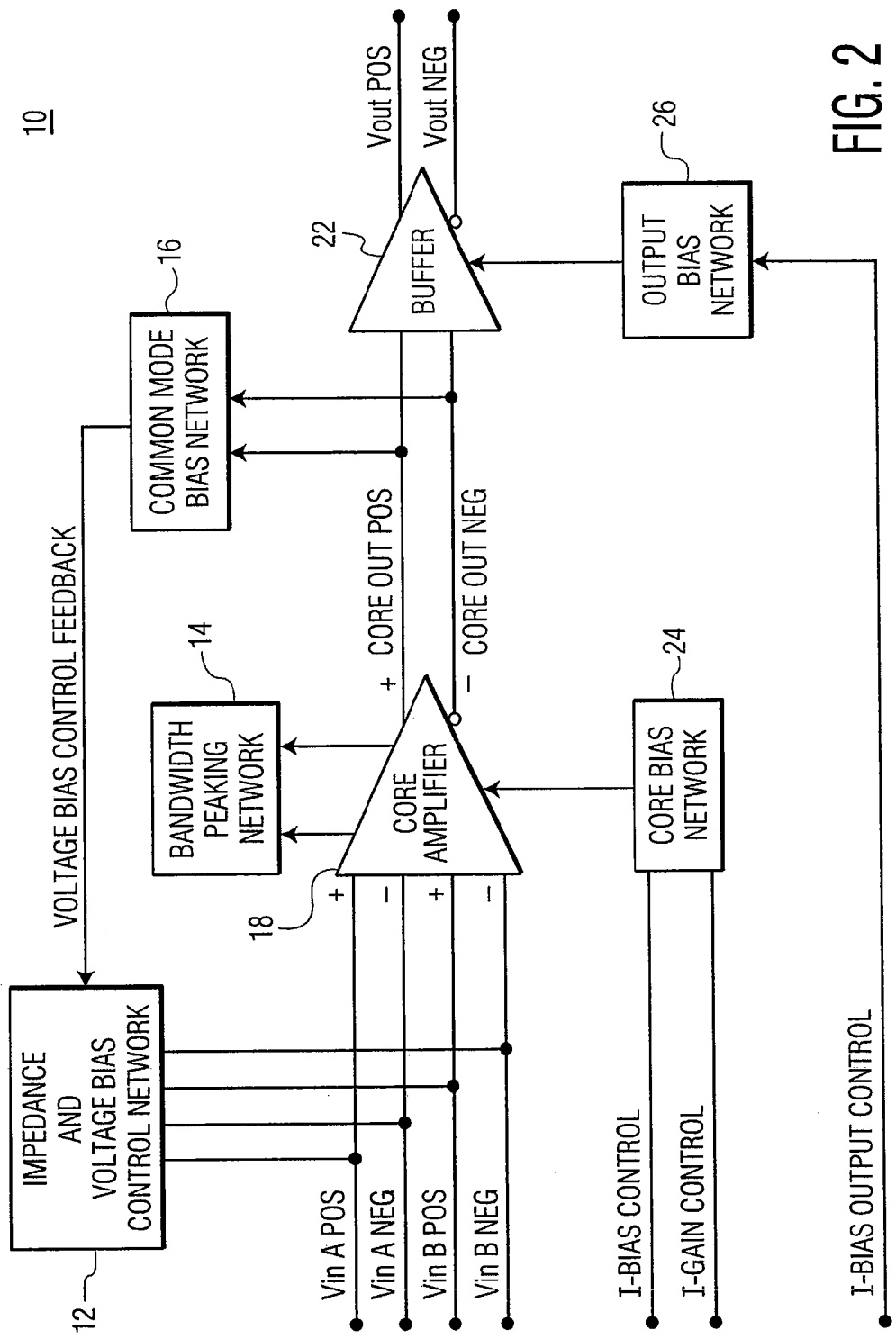
FIG. 2 is a functional block diagram of the ultra wide band active combiner shown in FIG. 1, in accordance with an embodiment of the present invention.

A functional block diagram of the ultra wide band active combiner is shown in FIG. 2. As shown, ultra wide band active combiner 10 includes core amplifier 18, which receives the positive input signals (Vin A pos and Vin B pos) and the negative input signals (Vin A neg and Vin B neg), being two pairs of differential input signals. The pair of differential output signals from core amplifier 18, namely the core positive output signal (core out pos) and the core negative output signal (core out neg) are buffered by buffer 22 to provide the positive output signal (Vout pos) and negative output signal (Vout neg).

The biasing of the transistors of core amplifier 18 (shown in FIG. 3) is provided by core bias network 24, which in turn is controlled by two input control signals of I-bias control and I-gain adjust. Biasing of the transistors of buffer 22 (shown in FIG. 4) is provided by output bias network 26, which in turn is controlled by an input signal of I-bias output control.

Core amplifier 18 provides a gain adjusted, constant amplification of 10 dBv across an ultra wide frequency band spanning from zero (DC) up to at least 20 GHz. The gain value of core amplifier 18 is maintained across the entire band of the combiner by use of bandwidth (BW) peaking network 14.

Ultra wide band active combiner 10 also includes tightly controlled input and output impedances. The input impedances are controlled by way of impedance and voltage bias control network 12, which in turn receives a voltage bias control feedback signal from common mode bias network 16. The common mode bias network 16 senses the voltage across the output terminals of core amplifier 18, as shown in FIG. 2. As will be described later, common mode bias network 16 includes a center tap node, which feeds back a common mode voltage to the impedance and voltage bias control network 12 at the input terminals of ultra wide band active combiner 10. Consequently, the same voltage bias value is supplied to the positive input terminal and the negative input terminal for both pairs of input signals.

Figure 3:
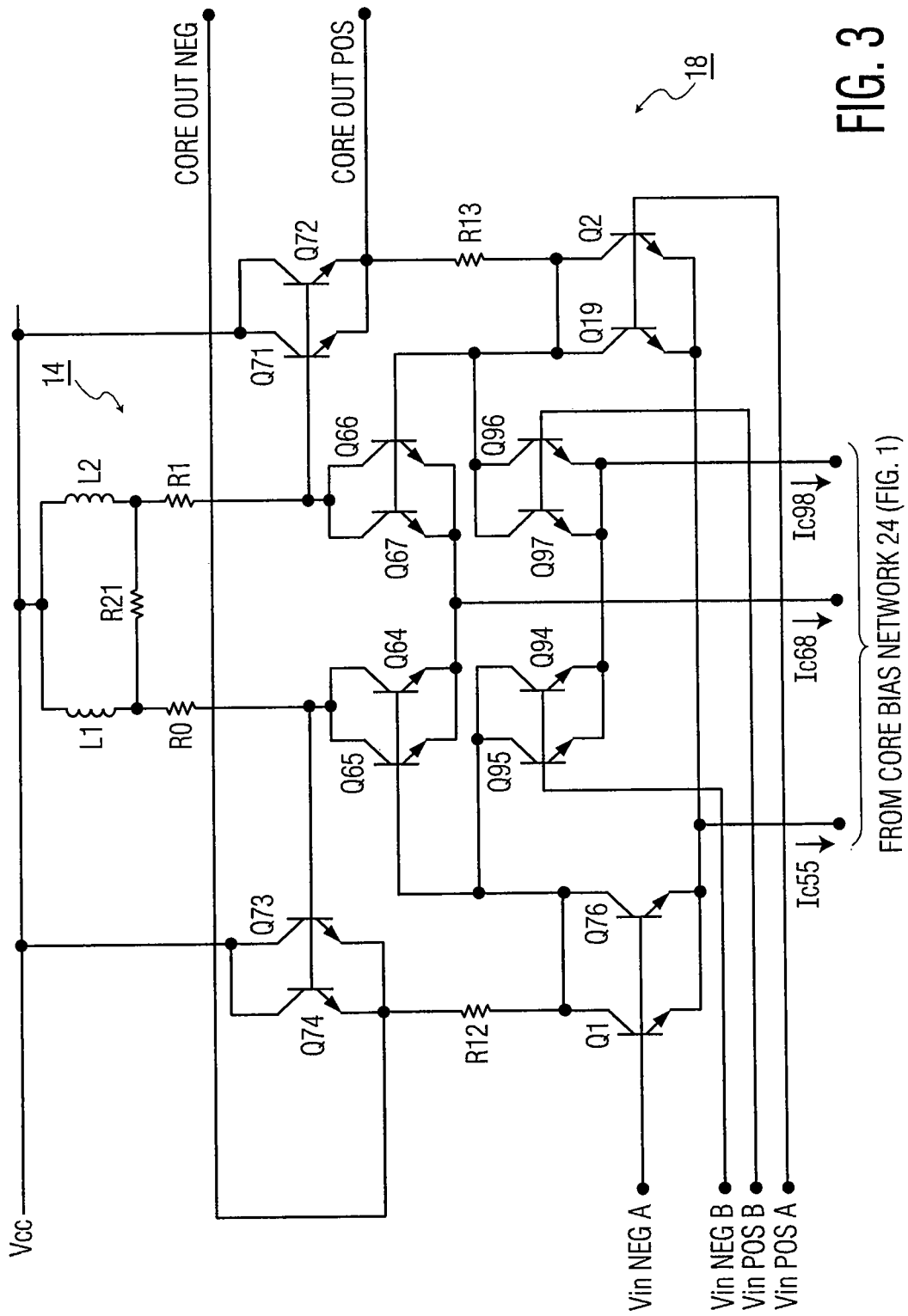
FIG. 3 is a schematic diagram of a bandwidth peaking network and a core amplifier shown in FIG. 2, in accordance with an embodiment of the present invention.

Referring next to FIG. 3, there is shown greater detail of core amplifier 18 and bandwidth peaking network 14. In the embodiment shown in FIG. 3, transistors Q1 and Q76 are physically two separate transistors on the die; it will be appreciated, however, that transistors Q1 and Q76 behave as one transistor (it is noted that the bases of the transistors are connected; the collectors of the transistors are connected; and the emitters of the transistors are connected). Similarly, transistors Q2 and Q19 behave as one transistor; transistors Q65 and Q64 behave as one transistor; transistors Q67 and Q66 behave as one transistor; transistors Q95 and Q94 behave as one transistor; transistors Q97 and Q96 behave as one transistor; transistors Q74 and Q73 behave as one transistor; and transistors Q71 and Q72 behave as one transistor.

A negative input signal for a first input (Vin A neg) is provided into core amplifier 18 by way of the bases of transistors Q1 and Q76; and a positive input signal for the first input (Vin A pos) is provided into core amplifier 18 by way of the bases of transistors Q2 and Q19. A negative input signal for a second input (Vin B neg) is provided into core amplifier 18 by way of the bases of transistors Q95 and Q94; and a positive input signal for the second input (Vin B pos) is provided into core amplifier 18 by way of the bases of transistors Q96 and Q97. The output signals, namely the core out negative signal and the core out positive signal are provided as output differential signals by way of, respectively, the emitters of transistors Q73 and Q74, and the emitters of transistors Q71 and Q72, which in turn are respectively connected to the collectors of transistors Q65 and Q64 and transistors Q67 and Q66. In this manner, core amplifier 18 effectively provides a differential output signal.

Figure 6:
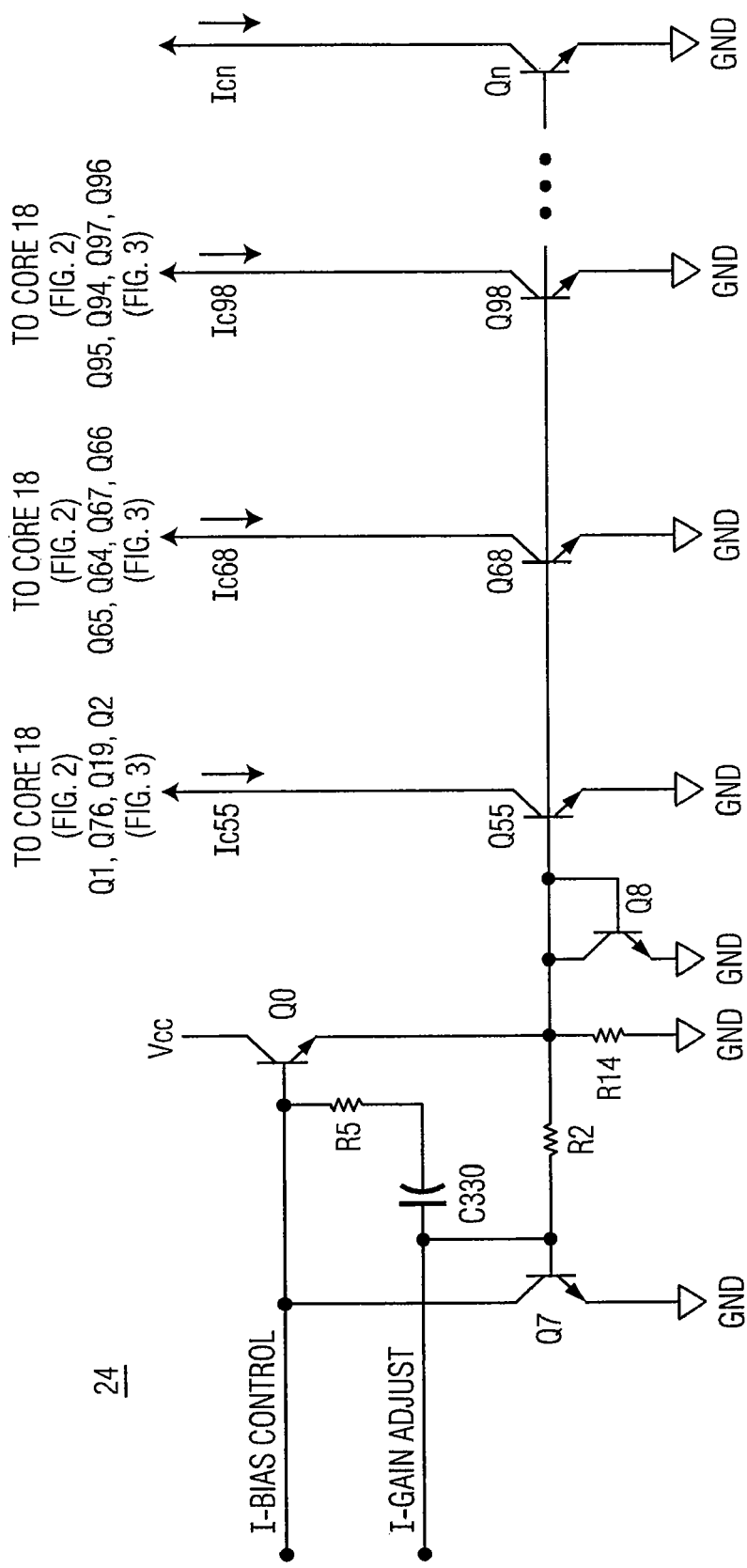
FIG. 6 is a schematic diagram of a core bias network shown in FIG. 2, in accordance with an embodiment of the present invention.

The biasing of the transistors of core amplifier 18 is provided by way of core bias network 24 (FIG. 6). As shown in FIG. 3, the emitters of transistors Q1, Q76, Q19 and Q2 are connected to core bias network 24. Each of these four emitters is biased by the same bias current (Ic55). Similarly, the emitters of transistors Q65, Q64, Q67 and Q66 are connected to core bias network 24. Each of these four emitters is biased by the same bias current (Ic68). Similarly, the emitters of transistors Q95, Q94, Q97 and Q96 are connected to core bias network 24. Each of these four emitters is biased by the same bias current (Ic98).

The collector output current from the combination of transistors Q1 and Q76 is provided as an input current into the bases of the combination of transistors Q64 and Q65. The collector output current from the combination of transistors Q94 and Q95 is also provided as an input current into the bases of the combination of transistors Q64 and Q65. In a similar manner, the collector output current from the combination of transistors Q2 and Q19 is provided as an input current into the bases of the combination of transistors Q66 and Q67; and the collector output current from the combination of transistors Q96 and Q97 is also provided as an input current into the bases of the combination of transistors Q66 and Q67. In this manner, the two pairs of differential input signals are combined.

The current flowing from the collectors of transistors Q65 and Q64 is provided to a first set of a resistor and inductor combination, namely R0 and L1 of the bandwidth peaking network 14. Similarly, the collector current provided by the combination of transistors Q67 and Q66 flows through a second set of a resistor and inductor combination, namely R1 and L2 of bandwidth peaking network 14. Another resistor (designated as R21), which is disposed between a node of R0 and L1 and another node of R1 and L2, is also configured to receive current from transistors Q64, Q65, Q66 and Q67.

It will be appreciated that the current flowing in the collectors of Q65 and Q64, and the current flowing in the collectors of Q67 and Q66, start rolling-off at a first predetermined frequency. On the other hand, with bandwidth peaking network 14 included in the present invention, as shown in FIG. 3, the impedance seen at the collectors of Q64, Q65, Q66 and Q67 increases with frequency compensating for the collector current roll-off.

Figure 11A:
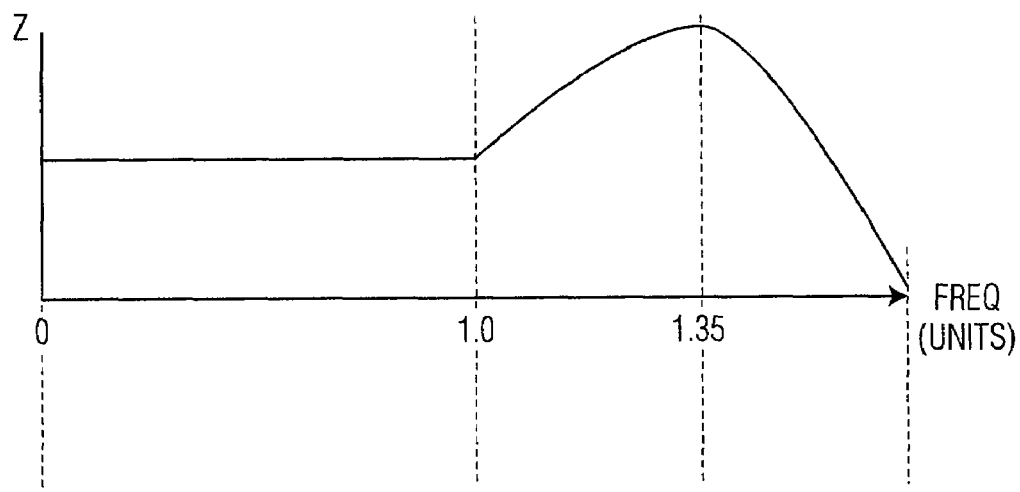
FIG. 11A is a plot of impedance level (Z) versus frequency (in arbitrary units)

The inventor has discovered that, preferably by experimentation, the gain provided by core amplifier 18 may be adjusted to have a substantially constant gain level from its lowest frequency response up to its maximum frequency response. This phenomenon is best shown by referring to FIGS. 11A and 11B. FIG. 11A provides a plot of impedance (Z) seen by the collectors of Q64, Q65, Q66 and Q67 versus frequency in arbitrary units. The inventor has shown that bandwidth peaking network 14 increases the frequency response of ultra wide band active combiner 10 by as much as 35 percent. For example, if one unit is defined as 11 GHz, then 1.35 units is at 15 GHz and, correspondingly, the upper frequency response of ultra wide band active combiner 10 is also at 15 GHz. As another example, if one unit is defined as 16 GHz, then 1.35 units is at 21.5 GHz and, correspondingly, the upper frequency response of ultra wide band active combiner 10 is also at 21.5 GHz.

Figure 11B:
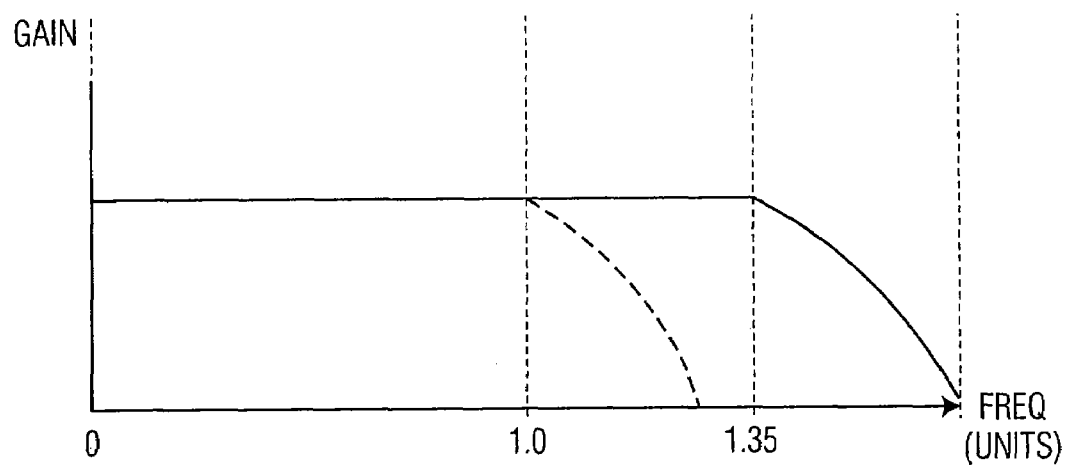
FIG. 11B is a plot of gain (dBv) versus frequency (in arbitrary units)

In operation, bandwidth peaking network 14 provides a substantially constant impedance level of Z up to 1.0 frequency units. From 1.0 frequency units up to 1.35 frequency units, the impedance level of Z increases, as shown in FIG. 11A. As a result, the gain of core amplifier 18, resulting from the combination of transistors Q64, Q65, Q66 and Q67 extends at a substantially constant value until reaching the frequency of 1.35 units, as shown in FIG. 11B.

The inventor has found that preferably R0 has a value and physical construction that is similar to the value and physical construction of R1. Furthermore, resistor R21 is substantially similar in value and physical construction to either resistor R0 or R1. Additionally, transistors Q64, Q65, Q66 and Q67 are preferably silicon germanium (SiGe) transistors which have a maximum transition frequency of 120 GHz. It will be appreciated that at the lower frequencies, bandwidth peaking network 14 presents an impedance that is substantially resistive in value. This is due to L1 and L2 having an inductive low impedance at the lower frequencies. Consequently, R0 and R1 are effectively directly connected to VCC, which results in R21 being free of any current flow.

It will be understood that the number and values of the components of bandwidth peaking network 14 on the die of the integrated circuit are complex. This is because there are many parasitic capacitances that exist between points across each physical resistor and points on the substrate of the die. Similarly, there are many parasitic capacitances that exist between points of each coil and points on the substrate. The impedance level Z varies as a function of frequency and is very complicated to calculate. As a result, the inventor prefers to find the resistive values of R0, R1 and R21 and the inductive values of L1 and L2 (which are equal to each other by symmetry) by experimentation. By experimentally adjusting the output gain response of core amplifier 18 to be at a constant gain of 10 dBv, across the entire frequency bandwidth the values of R0, R1, R21, L1 and L2 may be determined.

The manner in which the gain of core amplifier 18 is maintained at a constant value may be seen from the following simplified equations:

$Vout = I(\omega) \cdot Z(\omega)$ $I(\omega) = Vin \cdot gm(\omega)$ $Vout = Vin \cdot gm(\omega) \cdot Z(\omega)$ $Vout/Vin = gm(\omega) \cdot Z(\omega)$ where:

$Vin = VinA + VinB$, $gm(\omega)$ is the transconductance of the transistor as a function of frequency ($\omega$), $Z(\omega)$ is the impedance presented to the transistor, and Vout/Vin is the gain of the combiner.

The values of $Z(\omega)$ presented to core amplifier 18 by the bandwidth peaking network 14 (which includes resistances, inductances, and parasitic capacitances) are adjusted so that the gain of the ultra wide band active combiner 10 is maintained at a constant value over the desired frequency range.

Still referring to FIG. 3, there is shown resistor R12 connected between the collectors of transistor combination Q1 and Q76 and the emitters of transistor combination Q73 and Q74. Similarly, resistor R13 is connected between the collectors of the combination of transistors Q2 and Q19 and the emitters of the combination of transistors Q71 and Q72.

The positive core output and the negative core output differential signals are buffered by buffer 22 (FIG. 2), before the positive voltage output and negative voltage output differential signals are transmitted from ultra wide band active combiner 10. Buffer 22 is shown in more detail in FIG. 4. As shown, buffer 22 includes two transistors, designated as Q83 and Q85. The collector of each of these transistors is connected to VCC (nominally 3.0 volts), the base of each transistor receives one of the differential output signals from core amplifier 18, and the emitter of each transistor is biased by output bias network 26 (FIG. 2). The final differential output signals, namely Vout positive and Vout negative are provided by the emitters of Q83 and Q85, respectively. Thus, Q83 and Q85 behave as emitter followers and provide a gain value of less than one to the differential output signals of core amplifier 18.

Figure 4:
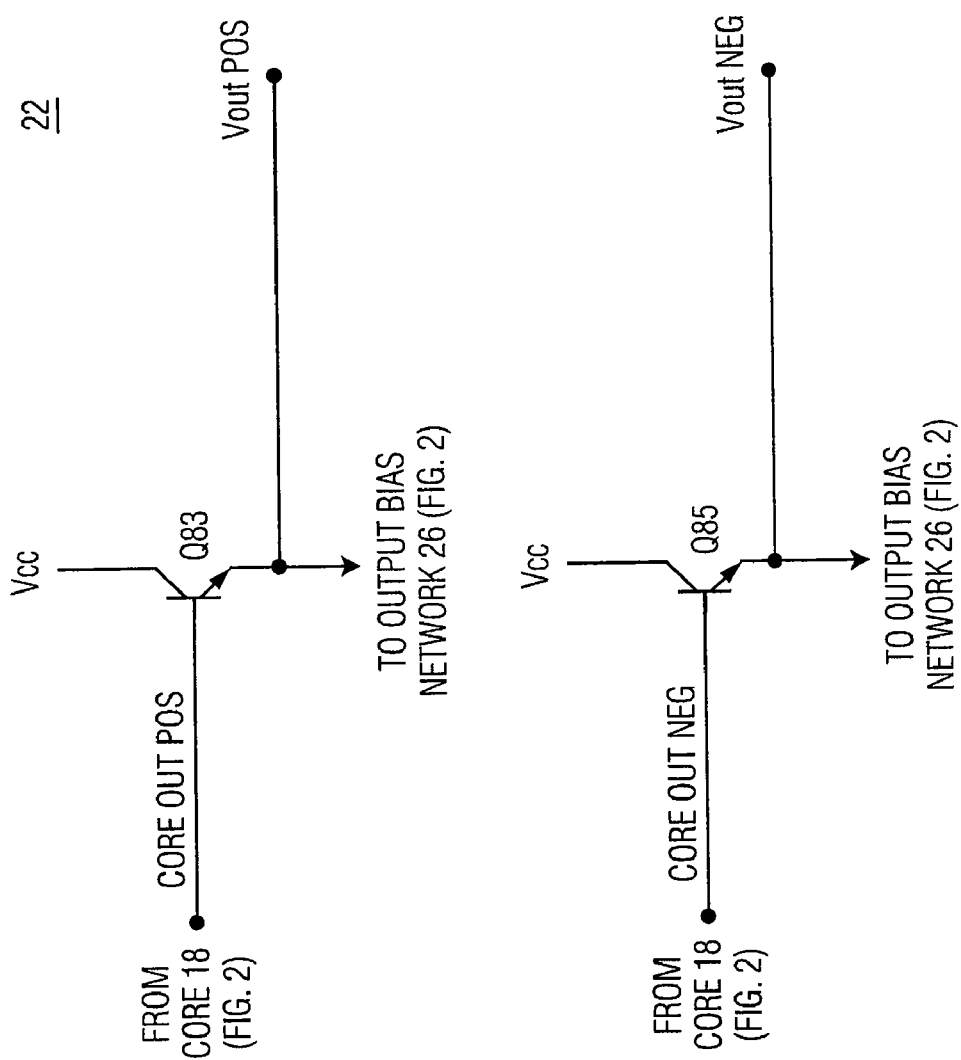
FIG. 4 is a schematic diagram of a buffer shown in FIG. 2, in accordance with an embodiment of the present invention.
Figure 5:
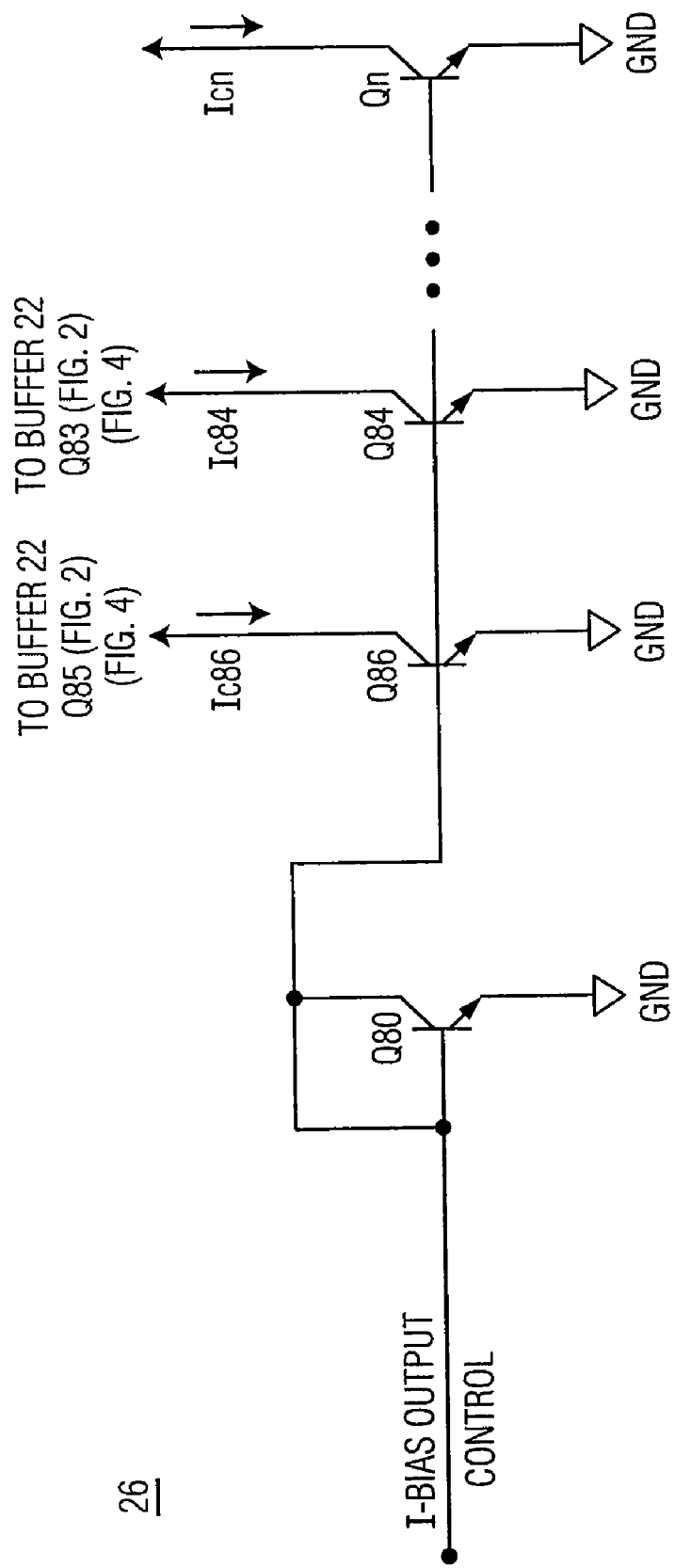
FIG. 5 is a schematic diagram of an output bias network shown in FIG. 2, in accordance with an embodiment of the present invention.

The biasing of the emitters of transistors Q83 and Q85 is shown in greater detail in FIG. 5. As shown, output bias network 26 provides a current bias to transistors Q83 and Q85 of buffer 22 (FIGS. 2 and 4). A collector current flowing in transistor Q84 is shown designated as Ic84 and biases the emitter of transistor Q83 of buffer 22 (FIGS. 2 and 4). Similarly, a collector current flowing in transistor Q86 is shown designated as Ic86 and biases the emitter of transistor Q85 of buffer 22 (FIGS. 2 and 4). It will be appreciated that the bases of transistors Q84 and Q86 are connected to each other and similarly controlled by the input signal of I-bias output control provided to transistor Q80. As shown, transistor Q80 has its collector and base connected together and coupled into output biasing transistors Q84 and Q86. Accordingly, the collector current of each of transistors Q84 and Q86 is substantially the same and the biases seen by the transistors of buffer 22 are substantially equal to each other.

More generally, output bias network 26 may include N biasing transistors in a chain, as shown. Each of the N biasing transistors have their bases connected together and coupled to input transistor Q80. The input signal of I-bias output control, which controls each transistor in the chain, may be used to set equal bias values to other transistors (not shown) in an output buffer stage (for example, buffer 22).

Having described output bias network 26, core bias network 24 will now be described. Referring to FIG. 6, there is shown core bias network 24. As shown, the core bias network is controlled by two input signals. The first input signal is I-bias control, which, for example, may have a nominal value of 500 µA in this embodiment. The second input signal is I-gain adjust, which, for example, may have a value of 10 µA per dB of gain reduction with a nominal range of 0 to 100 µA for a combiner gain of 10 dBv. The I-bias control signal is provided to the base of transistor Q0 by way of a compensation network of R5 and C330, which prevent oscillation of Q0. Transistor Q8 and resistor R14 are bleeding elements and prevent gain slope reversal that may happen for large values of I-gain adjust.

The bases of transistors Q55, Q68 and Q98 (and up to transistor Qn) are connected to the junction of R2 and R14. As a result, each of these biasing transistors provides the same biasing current to respective transistors of core amplifier 18. As shown, biasing transistor Q55 provides biasing current Ic55 to transistors Q1, Q76, Q19 and Q2 of core amplifier 18. Similarly, biasing transistor Q68 provides biasing current Ic68 to transistors Q65, Q64, Q67 and Q66 of core amplifier 18. Also similarly, transistor Q98 provides biasing current Ic98 to transistors Q95, Q94, Q97 and Q96 of core amplifier 18. Transistors Q55, Q68 and Q98 provide bias current related to their physical size relationship with respect to reference transistor Q7. In general, there may be additional core biasing transistors placed in a chain (up to Qn), which may be used to bias additional transistors (not shown) of another exemplary core amplifier.

In operation, an increase in I-bias control provides additional current flowing through the collector of the biasing transistors (Q55, Q68, Q98, up to Qn) which, in turn provide an increase in collector current flowing into core amplifier 18. In this manner, an increase in I-bias control results in an increase in gain of core amplifier 18.

Working in an opposite manner, an increase in I-gain adjust results in an increased IR voltage drop across resistor R2 and a decreased IR drop across resistor R14. Consequently, as I-gain adjust increases, the current flowing into Q55, Q68, Q98, up to Qn decreases in value. This, in turn, causes a decrease in the collector currents of biasing transistors Q55, Q68, Q98, up to Qn. A decrease in the collector currents of these biasing transistors reduces the gain of core amplifier 18.

Core biasing network 24 may include biasing transistors (for example Q55, Q68, Q98, up to Qn) that provide corresponding collector currents (for example Ic55, Ic68, Ic98, up to Icn) that are different from each other. As an example, transistor Q68 may be required to provide a collector current of Ic68 at a value of 2 mA, whereas transistor Q55 may be required to provide a collector current of Ic55 at a value of 1 mA. Such biasing ratio of 2 mA/1 mA may be achieved by implementing transistor Q68 physically twice as large as transistor Q55. As another example, transistor Q68 may be required to provide a collector current Ic68 at a value of 4 mA, whereas transistor Q55 may be required to provide a collector current Ic55 at a value of 1 mA. Such biasing ratio of 4 mA/1 mA may be achieved by implementing transistor Q68 physically four times larger than transistor Q55. In this manner, the present invention can maintain the desired biasing currents to core amplifier 18 at a fixed ratio based upon the physical size relationship among the biasing transistors.

Figure 7:
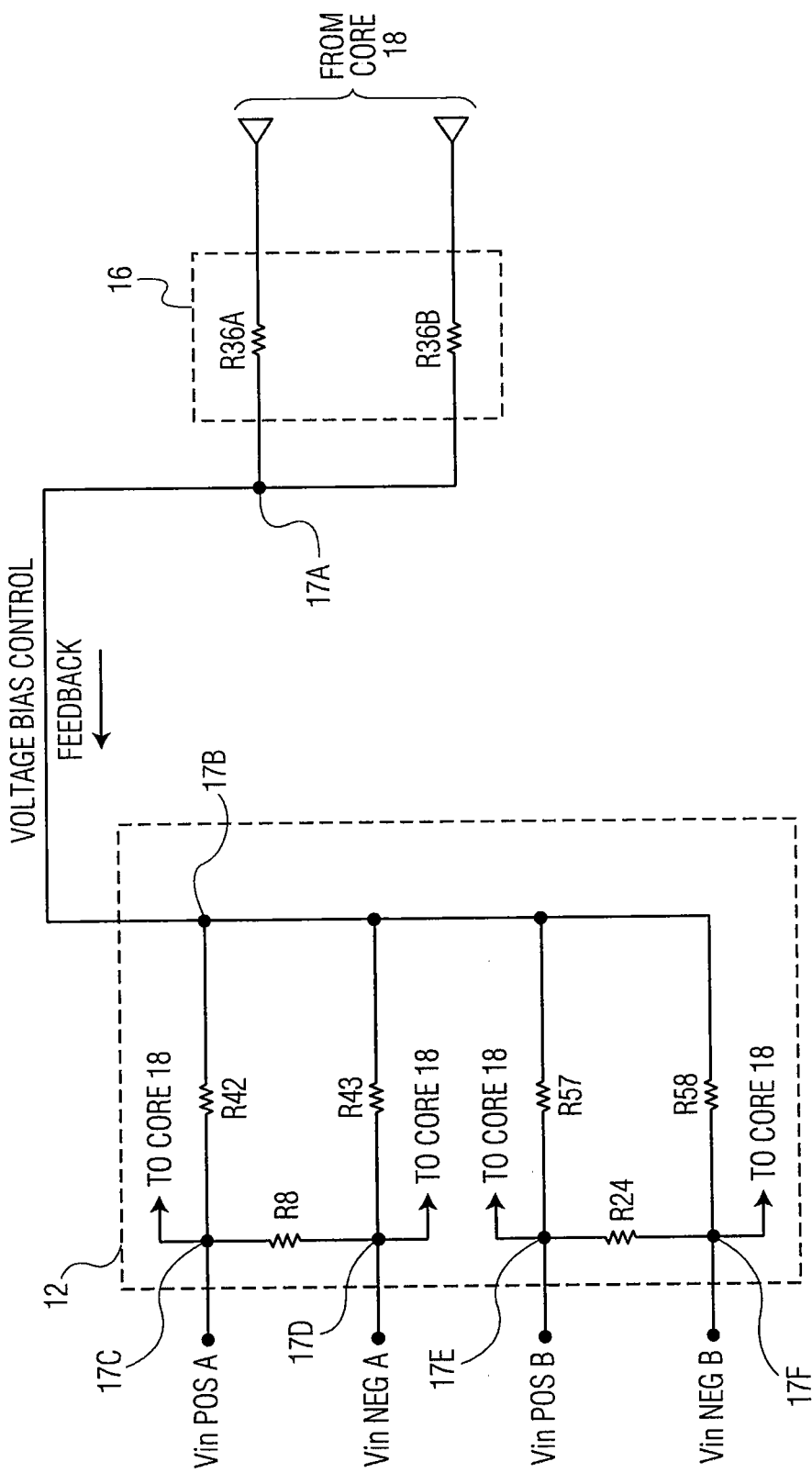
FIG. 7 is a schematic diagram of a common mode bias network and an impedance and voltage bias control network shown in FIG. 2, in accordance with an embodiment of the present invention.

Referring next to FIG. 7, the common mode bias network, designated as 16, and the impedance and voltage bias control network, designated as 12, will now be described.

The differential output from core amplifier 18 (FIG. 2), namely the voltage difference between the core out positive signal and the core out negative signal, is sensed by common mode bias network 16 by way of resistor R36A and resistor R36B. Since the signal voltage across R36A and R36B is equal in magnitude but opposite in sign, node 17A is effectively a virtual ground (Vg) and includes the common mode voltage generated between the positive signal output (core out positive) and the negative signal output (core out negative). This common mode voltage at node 17A is sensed by (or fed back to) node 17B as the voltage bias control feedback signal.

In operation, common mode bias network 16 senses the differential output voltage of core amplifier 18 and establishes a common center point as the common mode voltage. The common mode voltage is fed back to impedance and voltage bias control network 12. The common mode voltage is split by way of resistors R42 and R43, and resistors R57 and R58 to establish a common voltage bias at both pairs of input terminals (nodes 17C and 17D) to core amplifier 18 (transistors Q1, Q76, Q19 and Q2, and transistors Q95, Q94, Q97 and Q96, shown in FIG. 3).

The input impedance across the input A terminals is controlled by network 12 by way of resistor R8, which is connected between resistors R42 and R43. Since the impedance level looking back from core amplifier 18 has a high value, resistor R8 effectively establishes the impedance value at the input terminals of Vin A positive and Vin A negative. In the exemplary embodiment, the impedance level is 100 ohms between nodes 17C and 17D, and the impedance level is 50 ohms between each terminal and ground potential.

Similarly, the input impedance across the input B terminals is controlled by network 12 by way of resistor R24, which is connected between resistors R57 and R58. Since the impedance level looking back from core amplifier 18 has a high value, resistor R24 effectively establishes the impedance value at the input terminals of Vin B positive and Vin B negative. In the exemplary embodiment, the impedance level is 100 ohms between nodes 17E and 17F, and the impedance level is 50 ohms between each terminal and ground potential.

Figure 10:
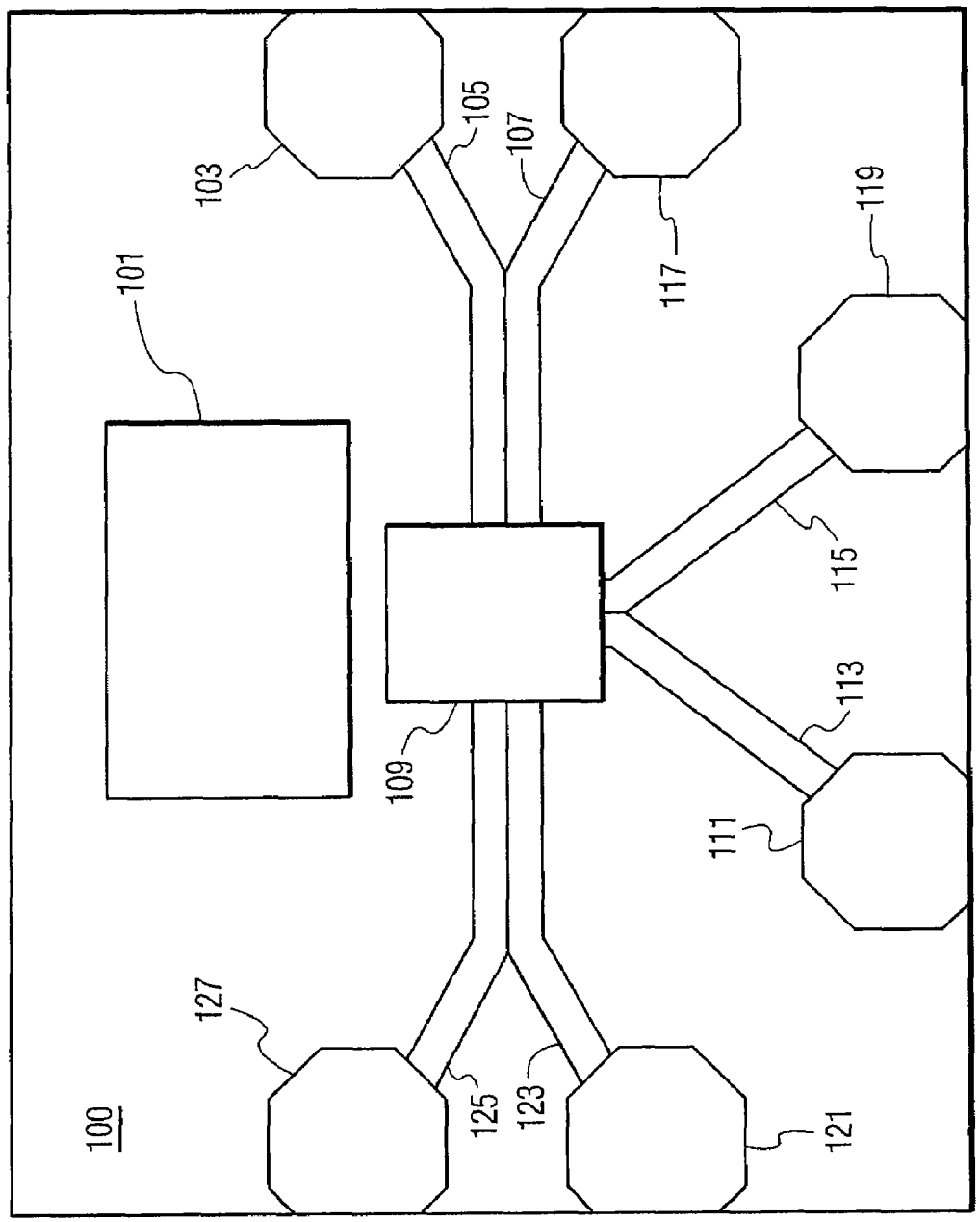
FIG. 10 is a layout diagram showing approximate sizes of various elements of the ultra wide band active combiner of FIG. 2, in accordance with an embodiment of the present invention.

It will be understood that ultra wide band active combiner 10 is entirely fabricated on a substrate of a die for use as an integrated circuit. The layout of the various components shown in FIG. 2 is complex and configured using CAD tools. A functional high level block diagram of the die, generally designated as 100, is shown in FIG. 10. It will be understood that FIG. 10 is not drawn to scale and much of the layout detail is not shown. The die 100 of the integrated circuit includes an area of approximately 1000 microns by 1000 microns. The input and output pads (designated as 111, 119 and 127, 121 and 103, 117) as well as the voltage and ground pads (not shown) are approximately 100 microns by 100 microns each.

The Y-shaped lines shown in FIG. 10 are the input transmission lines for input A (designated as 113 and 115), which are disposed between the input A pads (111, 119) and the core amplifier (designated as 109). Similarly, the Y-shaped input transmission lines for input B (designated as 125 and 123) are disposed between the input B pads (127, 121) and core amplifier 109. Also similarly, the Y-shaped output transmission lines (designated as 105 and 107) are disposed between the output buffer (shown as part of core 109) and the output voltage pads (103, 117). Also shown in FIG. 10 is the bandwidth peaking network (designated as 101), which is physically larger than core 109. The core 109 has a size of approximately 100 microns by 30 microns.

Each of the transmission lines has a controlled impedance of 50 ohms. The width of each transmission line is approximately 25 microns.

It will be appreciated that the transistors and the resistors are configured on the die to have a common centroid arrangement. For example, the transistors shown schematically in FIG. 3, namely the four groupings of Q1, Q76, Q19 and Q2; transistors Q95, Q94, Q97 and Q96; transistors Q64, Q65, Q66 and Q67; and transistors Q74, Q73, Q71 and Q72 are arranged as shown in FIG. 8. The arrangement of these transistors is shown designated generally as 80. Similarly, the resistors of common mode bias network 16, shown schematically in FIG. 7, are also configured on the die in a common centroid arrangement. As shown in FIG. 9, one half of resistor R36B is disposed in the first quadrant of arrangement 90 and the other half of resistor R36B is disposed in the third quadrant of arrangement 90. Similarly, resistor R36A is divided in half as shown, where one half is disposed in the second quadrant and the other half is disposed in the fourth quadrant.

Figure 12:
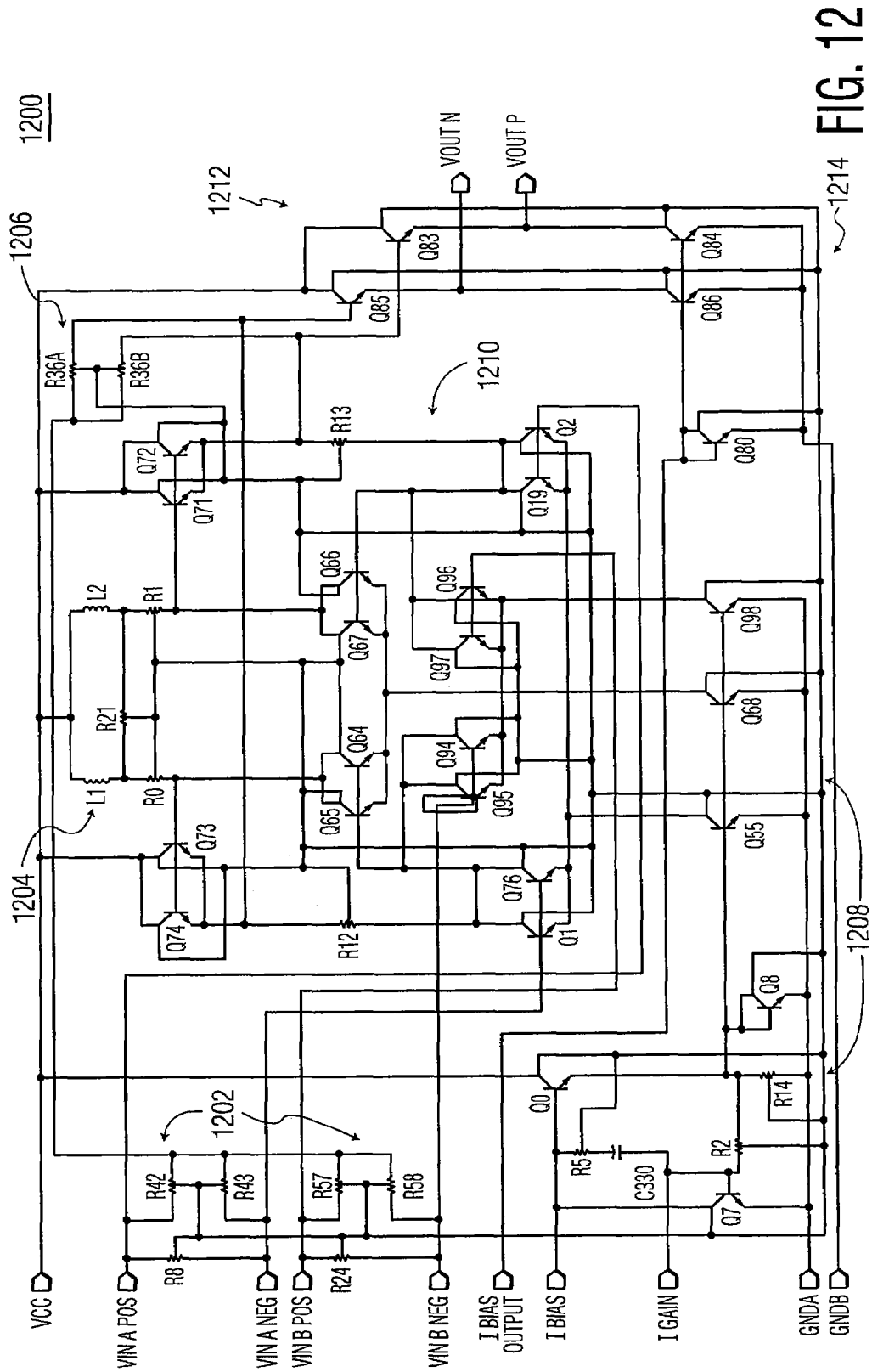
FIG. 12 is a detailed schematic diagram of the ultra wide band active combiner shown in FIGS. 1 and 2, in accordance with an embodiment of the present invention.

FIG. 12 depicts the ultra wide band active combiner in greater detail. As shown, ultra wide band active combiner 1200 includes impedance and voltage bias control network 1202 and common mode bias network 1206 (previously described by reference to FIG. 7). Also shown in FIG. 12 is a bandwidth peaking network 1204 and core amplifier 1210 (previously described by reference to FIG. 3). Buffer 1212 and output bias network 1214 (previously described, respectively, by reference to FIGS. 4 and 5) are shown on the right hand side of FIG. 12. Lastly, core bias network 1208 is shown at the bottom portion of FIG. 12 (previously described by reference to FIG. 6).

Also shown in FIG. 12 are connections from each transistor to the substrate of the die, connections from each resistor to the substrate, connections from each coil to the substrate, and connections from each capacitor to the substrate. These connections have been omitted in the other figures of ultra wide band active combiner 10. The ultra wide band active combiner shown in FIG. 12 is implemented using selective-epitaxial SiGe bipolar transistors. The transistors shown in FIG. 12 may also be implemented using other materials including, but not limited to silicon, GaAs, InP and AlGaAs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wideband combiner comprising
a core amplifier for receiving first and second pairs of differential input signals, and providing a single pair of differential output signals,
wherein the pair of differential output signals are a combination of the first pair and the second pair of differential input signals, and
a signal gain is implemented between the received first and second pairs of differential input signals and the single pair of differential output signals; and
a bandwidth peaking network including (a) a first coil and a first resistor connected in series and (b) a second coil and a second resistor connected in series,
the first coil and resistor and the second coil and resistor, respectively, coupled to the core amplifier for receiving amplified differential signals, and
the bandwidth peaking network configured to increase the frequency bandwidth of the amplifier.

2. The wideband combiner of claim 1, wherein
the core amplifier is configured to provide a gain value between the first and second pairs of differential input signals and the single pair of differential output signals.

3. The wideband combiner of claim 2, wherein
the gain is substantially constant across a frequency bandwidth response of the core amplifier.

4. The wideband combiner of claim 3, wherein the gain is adjustable.

5. The wideband combiner of claim 3, wherein
the frequency bandwidth response is between DC and at least 20 GHz.

6. The wideband combiner of claim 1, wherein
the bandwidth peaking network includes (a) a first node formed between the first coil and resistor and (b) a second node formed between the second coil and resistor,
a third resistor is connected between the first node and the second node, and
the third resistor is free-of current flow at low frequency operation of the core amplifier.

7. The wideband combiner of claim 1 further including
a common mode bias network coupled between output terminals providing the single pair of differential output signals and input terminals providing the first and second pairs of differential input signals, and
the common mode bias network providing a voltage bias control feedback signal from the output terminals to the input terminals,
wherein the voltage bias control feedback signal provides a virtual ground common mode potential.

8. The wideband combiner of claim 7, wherein
the common mode potential across the input terminals is substantially equal to a DC potential across the output terminals.

9. A wideband combiner comprising
a core amplifier for receiving first and second pairs of differential input signals and providing a single pair of differential output signals,
the core amplifier including a first amplifier and a second amplifier for receiving the first and second pairs of differential input signals,
a bandwidth peaking network including (a) a first coil and a first resistor connected in series and (b) a second coil and a second resistor connected in series, (c) a first node formed between the first coil and the first resistor and a second node formed between the second coil and the second resistor, and (d) a third resistor connected between the first node and the second node, and
the first amplifier coupled to an end of the first resistor and the second amplifier coupled to an end of the second resistor,
wherein the bandwidth peaking network is configured to increase the frequency bandwidth of the core amplifier, and
the core amplifier provides a signal gain between the received first and second pairs of differential input signals and the single pair of differential output signals.

10. The wideband combiner of claim 9 wherein
the first and second amplifiers each includes:
first and second stages of amplification, and
(a) the first and second stages of amplification of the first amplifier and (b) the first and second stages of amplification of the second amplifier are configured as physically similar to each other on a die.

11. The wideband combiner of claim 10 wherein
the first stage of amplification of the first amplifier and the first stage of amplification of the second amplifier are formed in at least one common centroid configuration on the die, and
the second stage of amplification of the first amplifier and the second stage of amplification of the second amplifier are formed in another common centroid configuration on the die.

12. The wideband combiner of claim 10 wherein
the first stage of amplification of the first amplifier and the first stage of amplification of the second amplifier are biased by one common voltage reference point, and the second stage of amplification of the first amplifier and the second stage of amplification of the second amplifier are biased by the same common voltage reference point.

13. The wideband combiner of claim 12 wherein
the common voltage reference point includes a voltage level provided into bases of a plurality of transistors, and
a first collector of the plurality of transistors supplies a first collector current for biasing the first stages of amplification, and
a second collector of the plurality of transistors supplies a second collector current for biasing the second stages of amplification.

14. The wideband combiner of claim 13 wherein
the first collector current and the second collector current are substantially similar to each other.

15. The wideband combiner of claim 13 wherein
the first collector current and the second collector current are proportional to each other, based on a ratio of the physical sizes on the die of the respective transistor supplying the first collect current and the respective transistor supplying the second collector current.

16. The wideband combiner of claim 13 wherein
current levels of the first and second collector currents are adjustable, and
the current levels are adjustable to provide a gain amount that is adjustable for the core amplifier.

17. The wideband combiner of claim 10 wherein
the first stage of amplification includes a dual set of transistors, and
each set of transistors receive one pair of the first and second pairs of differential input signals.

18. A wideband combiner comprising
a core amplifier for receiving first and second pairs of differential input signals across input terminals and providing a single pair of differential output signals across output terminals,
the core amplifier including a first amplifier and a second amplifier for receiving the first and second pairs of differential input signals,
a bandwidth peaking network including (a) a first coil and a first resistor connected in series and (b) a second coil and a second resistor connected in series, (c) a first node formed between the first coil and the first resistor and a second node formed between the second coil and the second resistor, and (d) a third resistor connected between the first node and the second node,
the first amplifier coupled to an end of the first resistor and the second amplifier coupled to an end of the second resistor, and
a common mode bias network coupled between the output terminals for providing a voltage bias control feedback signal across the input terminals,
wherein the bandwidth peaking network is configured to increase the frequency bandwidth of the core amplifier,
the core amplifier provides a substantially constant signal gain between the received single pair of differential input signals and the first and second pairs of differential output signals, and
the voltage bias control feedback signal provides a virtual ground common mode potential.

19. The wideband combiner of claim 18 wherein
the common mode potential across the input terminals is substantially equal to a DC potential across the output terminals, and
the differential pair of input signals and the first and second pairs of differential output signals have substantially the same DC voltage bias.

* * * * *